United States Patent
Kato

(10) Patent No.: US 7,679,109 B2
(45) Date of Patent: Mar. 16, 2010

(54) SEMICONDUCTOR DEVICE, LAYOUT DESIGN METHOD THEREOF, AND LAYOUT DESIGN DEVICE USING THE SAME

(75) Inventor: Yoshihiko Kato, Sakata (JP)

(73) Assignee: Seiko Epson Corporation (JP)

( * ) Notice: Subject to any disclaimer, the term of this patent is extended or adjusted under 35 U.S.C. 154(b) by 264 days.

(21) Appl. No.: 11/952,176

(22) Filed: Dec. 7, 2007

(65) Prior Publication Data

US 2008/0135881 A1 Jun. 12, 2008

(30) Foreign Application Priority Data

Dec. 8, 2006 (JP) .............................. 2006-331915

(51) Int. Cl.
*H01L 23/50* (2006.01)
(52) U.S. Cl. ................ 257/211; 257/752; 257/E23.079
(58) Field of Classification Search ................. 257/203, 257/E23.079, 210, 211
See application file for complete search history.

(56) References Cited

U.S. PATENT DOCUMENTS

| | | | |
|---|---|---|---|
| 4,916,514 A * | 4/1990 | Nowak ........................ | 257/758 |
| 5,639,697 A * | 6/1997 | Weling et al. ............... | 438/633 |
| 6,080,652 A * | 6/2000 | Yamaha et al. .............. | 438/622 |
| 6,614,120 B2 | 9/2003 | Sato et al. | |
| 7,163,870 B2 * | 1/2007 | Koubuchi et al. ........... | 438/424 |
| 2005/0161835 A1 | 7/2005 | Maeda | |
| 2007/0221957 A1 | 9/2007 | Kitajima et al. | |

FOREIGN PATENT DOCUMENTS

| | | |
|---|---|---|
| JP | 2003-045876 | 2/2003 |
| JP | 2004-356316 | 12/2004 |
| JP | 2005-019696 | 1/2005 |
| JP | 2005-236277 | 9/2005 |
| JP | 2006-165054 | 6/2006 |
| JP | 2006-196808 | 7/2006 |
| JP | 2006-319267 | 11/2006 |
| JP | 2007-250705 | 9/2007 |

* cited by examiner

*Primary Examiner*—Roy K Potter
(74) *Attorney, Agent, or Firm*—Harness, Dickey & Pierce, P.L.C.

(57) ABSTRACT

A semiconductor device having a multilayer structure, each layer including: a dummy pattern for ensuring a flatness thereof; a pad area in which a bonding pad is formed; an input-output circuit area in which an input-output circuit is formed, the input-output circuit area being adjacent to the pad area in plan view; and a dummy pattern confined area for forbidding an arrangement of the dummy pattern in every layer included in the semiconductor device, the dummy pattern confined area being provided between the pad area and the input-output circuit area in plan view.

7 Claims, 6 Drawing Sheets

SEMICONDUCTOR DEVICE, LAYOUT DESIGN METHOD THEREOF, AND LAYOUT DESIGN DEVICE USING THE SAME

The entire disclosure of Japanese Patent Application No. 2006-331915, filed Dec. 8, 2006 is expressly incorporated by reference herein.

BACKGROUND

1. Technical Field

The present invention relates to a semiconductor device fabricated using a chemical-mechanical polishing (CMP) method, the semiconductor device being provided with shallow trench isolation (STI) and wire structures. The present invention also relates to a layout design method of such semiconductor device and a layout design device that uses the method.

2. Related Art

Commonly introduced elements and wiring structures of semiconductor devices have thin-film multilayer structures, in order to make semiconductor devices more highly integrated and greatly reduced in scale. The manufacturing of these elements involves a CMP method for planarizing deposited surfaces, and the flatness of the substrate polished by this method depends on the layout of the wirings. In order to ensure the flatness, a suggested method includes the forming of dummy wirings (refer to JP-A-2003-45876 for an example). In order to ensure the flatness in a semiconductor substrate that has element isolation regions formed with STI, a suggested method includes forming dummy activation areas in an STI structure (refer to JP-A-2004-356316 for an example).

As described, the flatness in the CMP polishing is ensured by patterning dummy wirings and dummy activation areas.

These cases, however, may involve occurrences of phenomenon where static electricity is transmitted to internal circuits.

The cause of the above is determined to be an involuntarily formed conductive channel created by patterning the dummy activation areas, causing the static electricity flown in through the input-output pad to be transmitted to the internal circuits through the dummy activation areas.

SUMMARY

An advantage of the invention is to provide a semiconductor device with a layout that avoids causing problems to internal circuits, a method for designing a layout of such semiconductor device, and a layout design device that uses the method, where the problems are caused by an involuntarily formed conductive channel created by dummy activation areas and dummy wirings which are provided in order to ensure the flatness of the semiconductor device.

According to a first aspect of the invention, a semiconductor device that has a multilayer structure includes, in each layer, a dummy pattern for ensuring a flatness thereof; a pad area in which a bonding pad is formed; an input-output circuit area in which an input-output circuit is formed, the input-output circuit area being adjacent to the pad area in plan view; and a dummy pattern confined area for forbidding an arrangement of the dummy pattern in every layer included in the semiconductor device, the dummy pattern confined area being provided between the pad area and the input-output circuit area in plan view.

This allows avoiding the involuntary formation of conductive channel through bonding pads and through dummy patterns, as well as avoiding the electrostatic connection within the internal circuit through the conductive channel.

In this case, the dummy pattern confined area is provided between the pad area and the input-output circuit area adjacent thereto, only if a distance therebetween is equal to or less than a defined value set in advance. Here, the defined value is set to produce a distance which allows ensuring the flatness.

With this structure, the dummy pattern is provided if the above distance is larger than the determined value. Therefore, the flatness is ensured, since the dummy pattern is set when the distance between the pad area and the input-output circuit is relatively long, and is predicted that the flatness cannot be ensured.

In this case, the dummy pattern serves as a dummy wiring, and the bonding pad and the input-output circuit constitute a circuit having a multilayer pad structure. Here, every layer thereof is lower than the bonding pad, and includes a conductor arranged on the entire surface of the pad area in plan view. Moreover, the dummy pattern confined area is provided, in plan view, to the pad area, to the input-output circuit area, and to a power separation circuit area in which a power separation circuit for separating a power system is formed.

This ensures avoiding an involuntary occurrence of conductive channels, by providing the dummy pattern confined areas in the pad area, in the input-output circuit area, and in the power separation circuit area for separating the power system.

In this case, the dummy pattern serves as a dummy wiring, and the bonding pad and the input-output circuit constitute a circuit having a structure in which the bonding pad is formed only on the top layer of a multilayer wiring. Here, a wiring is formed in the pad area in plan view, and is included in each lower layer under the bonding pad. Moreover, the dummy pattern confined area is provided, in plan view, to the input-output circuit area, to a power separation circuit area in which a power separation circuit for separating a power system is formed, and to an area having a predetermined width set in advance, the area being peripheral to the pad area.

This ensures avoiding an involuntary occurrence of conductive channels, by providing the dummy pattern confined areas in the above areas.

In this case, the dummy pattern serves as a dummy activation area formed in a moiety of shallow trench isolation structure, and the dummy pattern confined area is provided, in plan view, also to the power separation circuit area in which the power separation circuit for separating the power system is formed.

This ensures avoiding an involuntary occurrence of conductive channels, by providing the dummy pattern confined areas also for the power separation circuits for separating the power system, in the case of dummy pattern being a dummy activation area formed in the STI structure.

According to a second aspect of the invention, a method for designing a layout of a semiconductor device having a multilayer structure provided with a dummy pattern for ensuring a flatness, the method includes providing a dummy pattern confined area to every layer in the semiconductor device. Here, the dummy pattern confined area is for forbidding an arrangement of the dummy pattern, and is provided to at least, in plan view, between a pad area and an input-output circuit area. At the same time, the pad area includes a bonding pad formed therein, and the input-output circuit area is adjacent to the pad area and includes an input-output circuit formed therein.

This allows avoiding the involuntary formation of conductive channel through bonding pads and dummy patterns, as well as avoiding the electrostatic connection within the internal circuit through the conductive channel.

According to a third aspect of the invention, a layout design device for designing a layout of a semiconductor device includes input means, search means, confined area configuration means, and dummy pattern arraning means. The input means inputs device information including placement position information of each unit constituting a semiconductor device which has a multilayer structure provided with a dummy pattern for ensuring flatness. Here, a layout design is carried out seperately for each layer constituting the semiconductor device. The search means searches, in each layer, a presence of an area which fulfills a configuration condition of a dummy pattern confined area. Here, the configuration condition is set in advance, and the search is carried out based on the device information input by the input means. The confined area configuration means sets, in each layer, the dummy pattern confined area, if an area which fulfills the configuration condition is found by the search means. Here, the dummy pattern confined area is set in an area which corresponds to the area found. The dummy pattern arranging means arranges a dummy pattern in an area excluding an area in which the dummy pattern confined area is set by the confined area configuration means. At this time, the configuration condition of the dummy pattern confined area includes, in top view, an area being at least between a pad area and an input-output circuit area. Here, the pad area includes a bonding pad formed therein, and the input-output circuit area is adjacent to the pad area and includes an input-output circuit formed therein.

According to the above structure, the device allows avoiding an involuntary formation of conductive channel through bonding pads as well as through dummy patterns, caused by the arrangement of dummy patterns.

BRIEF DESCRIPTION OF THE DRAWINGS

The invention will be described with reference to the accompanying drawings, wherein like numbers reference like elements.

DESCRIPTION OF EXEMPLARY EMBODIMENTS

An embodiment of the present invention will now be described.

Figure 1:
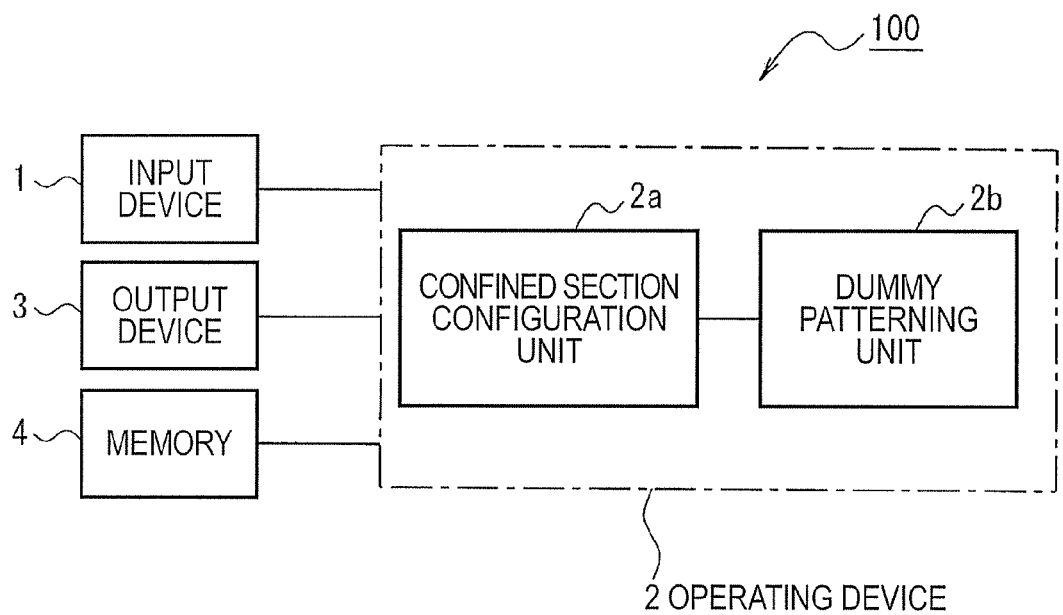
FIG. 1 is a schematic block diagram illustrating an example of a layout design device according to one aspect of the invention.

FIG. 1 is an example of a layout design device 100 to which aspects of the invention are applied. This layout design device 100 includes an input device 1, an operating device 2, an output device 3, and a memory unit 4 for storing various sets of information. The input device 1 includes a keyboard and an interface for inputting CAD product data which contains the placement information of components constituting a semiconductor device for designing the layout thereof. Examples of components include a bonding pad (hereafter referred to as a pad), an input-output circuit, an internal circuit thereof, and a wiring coupling the aforementioned components. The operating device 2 sets, based on the product CAD data input thereto, dummy pattern confined sections (dummy pattern confined areas) for assigning areas to forbid patterning dummy activation areas and dummy wirings (i.e. dummy patterns) used for planarizing a semiconductor device, the dummy pattern being arranged without serving their original function. The output device 3 includes units such as a display and a printer for displaying the placement of the circuit blocks and the dummy pattern confined areas, based on the product CAD data. The operating device 2 includes a confined section configuration unit 2a for setting a confined section, and a dummy patterning unit 2b for arranging, in the predetermined steps, dummy wirings or dummy activation areas in the areas except for the confined areas set by the confined section configuration unit 2a.

The product CAD data includes sets of information such as: an indication of a circuit block being either a multilayer pad structure circuit or a multilayer wiring circuit in which bonding pads are formed only on the top layer of the multilayer wirings, while wirings are formed in the layers underneath the bonding pads; and placement positions of constituents of each circuit blocks, the constituents including pads, input-output circuits, power separation circuits, and other internal circuits.

Figure 2A:
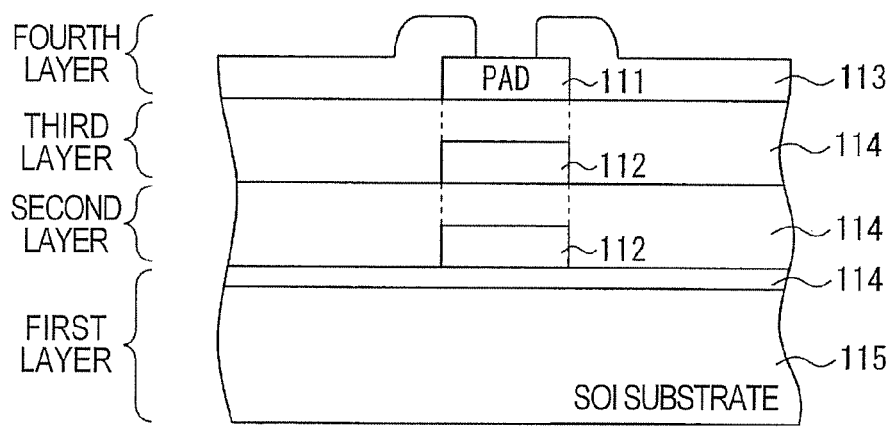
FIGS. 2A and 2B are drawings describing a multilayer pad structure circuit and a multilayer wiring circuit.

Here, the multilayer pad structure circuit has a structure in which, as shown in FIG. 2A, each layer under a bonding pad 111 includes conductors 112 patterned on each of the entire pad areas. The pad areas overlap, when viewed from the top, with the patterned position of the bonding pad 111.

Figure 2B:
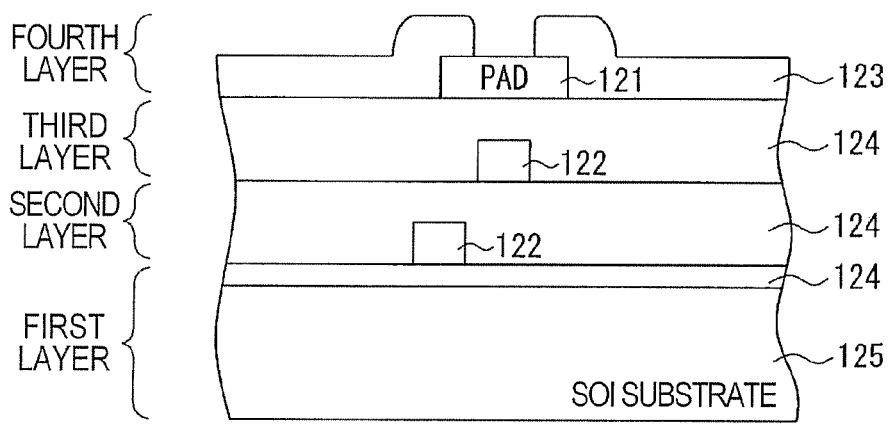

As shown in FIG. 2B, the multilayer wiring circuit includes wirings 122 formed in the layers under a bonding pad 121.

Referring back to FIG. 2A, the drawing illustrates a protection film 113, interlayer insulating films 114, and a semiconductor substrate 115 such as SOI substrate composed with silicon. Referring back to FIG. 2B, the drawing illustrates a protection film 123, interlayer insulating films 124, and a semiconductor substrate 125 such as SOI substrate composed with silicon.

The layout design method carried out by the layout design device 100 will now be described.

The layout design device 100 designs the layout separately for each layer illustrated in FIG. 2A, where a first layer refers to the portion including the semiconductor substrate 115 and one of the interlayer insulating films 114 formed thereon, a second layer refers to a portion thereon including one of the conductors 112 and one of the interlayer insulating films 114, a third layer refers to the portion thereon including the same components as that of the second layer, and a fourth layer refers to a portion including the bonding pad 111 and the protection film 113 formed thereon. The second and the third layers containing the conductors 112 include dummy wirings arranged thereon, and the first layer includes a dummy activation area arranged thereon, the first layer containing the semiconductor substrate 115 on which element isolation regions are formed.

Similarly, referring back to FIG. 2B, the layout design device 100 designs the layout separately for each layer illustrated in the drawing, where a first layer refers to the portion including the semiconductor substrate 125 and one of the interlayer insulating films 124 formed thereon, a second layer refers to a portion thereon including one of the wirings 122 and one of the interlayer insulating films 124, a third layer refers to the portion thereon including the same components as that of the second layer, and a fourth layer refers to a portion including the bonding pad 121 and the protection film 123 formed thereon. The second and the third layers containing the wirings 122 include dummy wirings patterned thereon, and the first layer includes a dummy activation area patterned therein, the first layer containing the semiconductor substrate 125 on which element isolation regions are formed.

Figure 3:
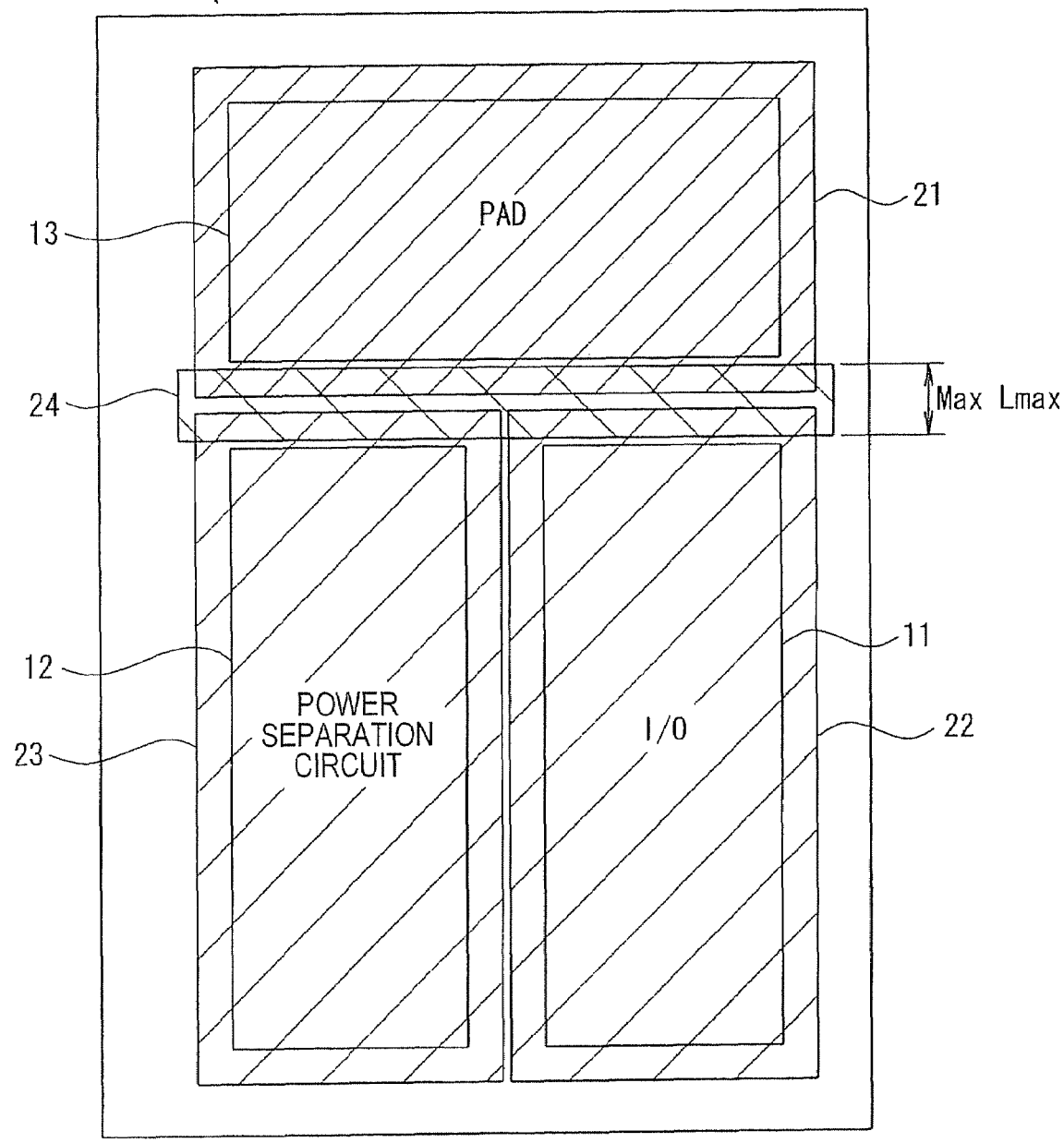
FIG. 3 is an example of a dummy wiring confined section set in the multilayer pad structure circuit.

FIG. 3 is a plan view schematically illustrating a part of a semiconductor device that undergoes dummy patterning. This semiconductor device has a multilayer structure including wirings and conductors formed with materials such as aluminum, these wirings and conductors being deposited, having interlayer insulating films therebetween, on a semiconductor substrate such as an SOI substrate on which the element regions and the element isolation regions provided in an STI structure are formed, thereby constituting the aforementioned multilayer pad structure circuit and multilayer wiring circuit.

FIG. 3 illustrates a plan view of one of the layers in the multilayer semiconductor device, particularly a part of the area in the multilayer pad structure circuit, showing a layer in which the conductors are formed (hereafter also referred to as a conductor-forming layer, being equivalent to, for instance, the second layer in which one of the conductors 112 is formed, as shown in FIG. 2A).

As shown in FIG. 3, the multilayer pad structure circuit includes an input-output circuit (I/O), a pad, a power separation circuit for blocking a power line Vss which is coupled to a node provided with a ground voltage, and other un-illustrated internal circuits. When viewed from top as shown in FIG. 3, these components are arranged in a following manner. An input-output circuit area 11 and a power separation circuit area 12 are arranged adjacently to each other, both areas respectively being equivalent to an input-output circuit placement position and to a power separation circuit placement position. A pad area 13 equivalent to a pad placement position is arranged adjacently to both input-output circuit area 11 and the power separation circuit area 12. The un-illustrated internal circuits are arranged as necessary.

In the conductor-forming layer of this multilayer pad structure circuit, the dummy pattern confined sections are configured, specifically, to the areas corresponding to the components constituting the multilayer pad structure circuit, so as to forbid the patterning of dummy wirings in those areas, in accordance with the manner indicated in Table 1.

TABLE 1

| Area | Dummy Wirings |
| --- | --- |
| Pad | Forbidden. In case of the multilayer wiring circuit, confined in its periphery only. |
| Between Pad and I/O | Forbidden when a distance therebetween is equal to Lmax or less. |
| I/O | Forbidden |
| Power Separation Circuit | Forbidden only in the multilayer pad structure circuit. |

The dummy pattern confined sections are set not only in the pad area 13, the input-output circuit area 11, and the power separation circuit area 12, but also in the area between the pad area 13 and the input-output circuit area 11. In case of the multilayer pad structure circuit, a conductor (equivalent to each of the conductors 112 shown in FIG. 2A) is deposited on the entire pad area 13 of each layer. Therefore, there is no need to additionally pattern a dummy wiring in this pad area 13. Thus the dummy pattern confined section is set to the pad area 13. Moreover, there is no need to pattern a dummy wiring neither in the input-output circuit area 11 nor in the power separation circuit area 12, since the wirings constituting the circuits are formed in those areas. Based on this decision, the dummy pattern confined sections are set also in those areas.

The dummy pattern confined section is set between the pad area 13 and the input-output circuit area 11, in order to avoid the involuntary formation of a conductive channel flowing from the pad through a dummy wiring. Here, the dummy pattern confined section is set only if the distance between the pad area 13 and the input-output circuit area 11 is equal to the preset maximum value Lmax or less. The flatness cannot be insured without providing a dummy pattern if the distance between the pad area 13 and the input-output circuit area 11 exceeds a certain length. Therefore, the dummy pattern confined section is not set, if the distance between the pad area 13 and the input-output circuit area 11 exceeds the length predicted to assure the flatness thereof during the subsequent CMP polishing process and other subsequent process without arranging the dummy pattern. In this case, securing the flatness is prioritized and the dummy pattern is generated, even though the possibility of an involuntary formation of a conductive channel is present. On the other hand, if the distance is within the range that ensures the flatness, the dummy pattern confined section is set in order to avoid the involuntary formation of a conductive channel. Therefore, the distance represented by the maximum value Lmax between the pad area 13 and the input-output circuit area 11 is set to, for instance, approximately 50 μm, being equivalent to the shortest distance predicted not to ensure the flatness during the subsequent CMP polishing process and other subsequent process.

According to the rule of setting the dummy pattern confined sections described in Table 1, dummy pattern confined sections 21, 22, and 23 are respectively set to the pad area 13, to the input-output circuit area 11, and to the power separation circuit area 12. At the same time, if the distance between the pad area 13 and the input-output circuit area 11 is equal to the value Lmax or less, a dummy pattern confined section 24 is set therebetween. The dummy pattern confined sections are illustrated in hatchings in FIG. 3.

As a result, in the subsequent dummy pattern deposition process, the dummy patterns formed with dummy wirings are not patterned in the areas where the dummy pattern confined sections 21 to 24 are set. The dummy patterns are spaced in prescribed intervals, and are patterned in the area except for the dummy pattern confined sections. In a semiconductor device provided with the dummy wirings that are patterned in accordance with the above dummy patterning, the dummy patterns are not present in the areas between the pad area 13 and the input-output circuit area 11, as well as between the pad area 13 and the power separation circuit area 12. This prevents the distance between the dummy wirings and the input-output circuit area 11 to become shorter than necessary, avoiding the transmission of static electricity from the pad into the input-output circuit, through the conductive channel which is involuntarily formed due to the deposition of the dummy wirings.

Figure 4A:
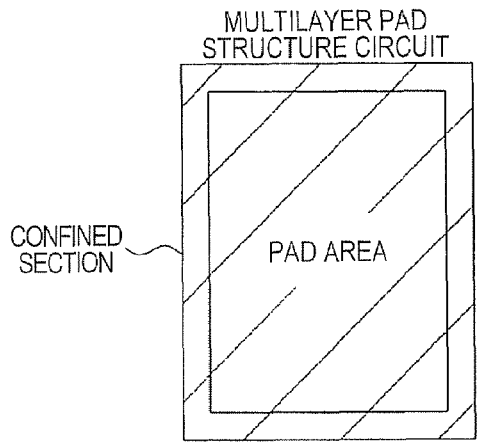
FIGS. 4A and 4B are explanatory drawings describing a configuration of a dummy pattern confined section in a pad area.
Figure 4B:
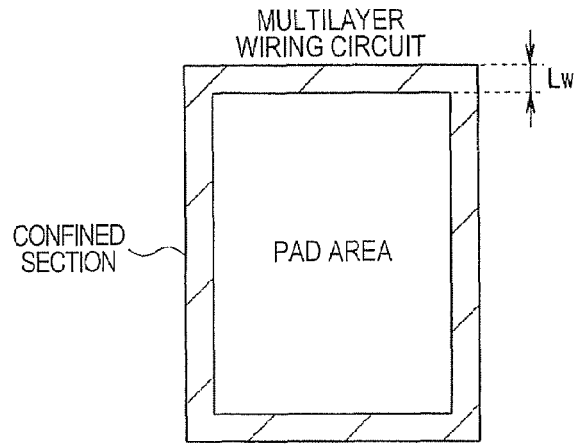

The rule of setting the dummy pattern confined sections in the layer in which the wirings of the multilayer wiring circuit are formed will now be described. This layer corresponds, for instance, to a second layer in which one of the wirings 122 in FIG. 2B is formed, and hereafter may also be referred to as the wiring-forming layer. The wiring-forming layer in the multilayer wiring circuit is also set in accordance with the rule shown in Table 1. However, the dummy pattern confined section for the pad area 13 in case of the multilayer wiring circuit is set only in the periphery of the pad area 13. In other words, since the multilayer wiring circuit is formed including an active surface bumps, depending on how the wirings are patterned in the pad area, (the wirings may be formed on the entire pad area when viewed from top, or, may be patterned less densely), the flatness may not be ensured in the subsequent processes. Therefore, in contrast to the case of the multilayer pad structure circuit, where, as described above, the conductor is arranged on the entire surface of the pad area 13 in top view, and where the dummy pattern confined section is set as an area including the pad area 13, the area being slightly wider than the pad area 13 as shown in FIG. 4A, the dummy pattern confined section is set, not in the pad area 13 as shown in FIG. 4B, but only in the area with a predetermined perimeter width Lw, the area being peripheral to the pad area 13. The perimeter width Lw of the dummy pattern confined section set in the periphery of the pad area 13 is set, for instance, to 4 μm, if a static electricity withstand voltage is, for instance, 4000V and more. Here, the static electricity withstand voltage indicate a voltage predicted to be able to avoid the transmission of the flown-in static electricity through the conductive dummy pattern.

Figure 5:
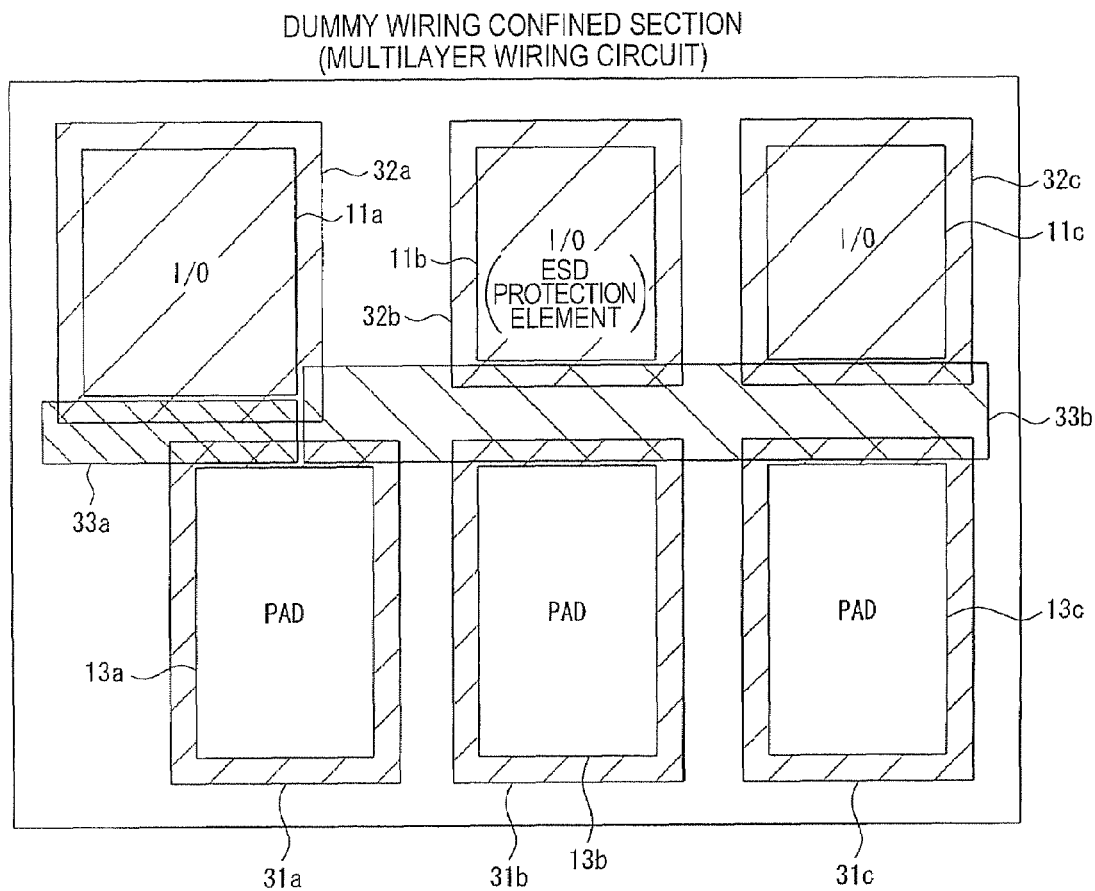
FIG. 5 is an example of a dummy wiring confined section set in the multilayer wiring circuit.

Consequently, as illustrated with hatchings in FIG. 5, according to the rule of setting the dummy pattern confined sections described in Table 1, dummy pattern confined sections 31a to 31c are set to the areas, each having a predetermined perimeter width Lw and being peripheral to the pad areas 13a to 13c, and dummy pattern confined sections 32a to 32c are set to input-output circuit areas 11a to 11c. At the same time, if the distance between the pad area 13a and the input-output circuit area 11a is equal to the value Lmax or less, a dummy pattern confined section 33a is set therebetween. Similarly, if the distance between the pad area 13b and the input-output circuit areas 11b as well as between the pad area 13c and the input-output circuit areas 11c are equal to the value Lmax or less, then the dummy pattern confined section 33b is set in the area therebetween.

Therefore, in the subsequent dummy pattern deposition processes, no dummy pattern formed with dummy wirings is arranged in the areas where these dummy pattern confined sections are set. In a semiconductor device provided with the dummy wirings that are patterned in accordance with the above dummy patterning, the dummy patterns are not present in the area between the pad area 13 and the input-output circuit area 11. This prevents the distance between the dummy wirings and the input-output circuit area 11 to become shorter than necessary, avoiding the transmission of static electricity from the pad into the input-output circuit, through the conductive channel which is involuntarily formed due to the deposition of the dummy wirings.

The rule of setting the dummy pattern confined sections for forbidding the arrangement of the dummy activation area will now be described. The description applies to the case of forming the dummy activation area in the STI structure of the semiconductor substrate. In the case of the STI structure, the dummy pattern confined sections are set based on the rules described in Table 2, regardless of whether the substrate is for the multilayer wiring circuit or for the multilayer pad structure circuit.

TABLE 2

| Area | Dummy Wiring |
| --- | --- |
| Pad | Created |
| Between Pad and I/O | Forbidden when a distance therebetween is equal to Lmax or less. |
| I/O | Created |
| Power Separation Circuit | Forbidden. Applicable only in the multilayer pad structure circuit. |

That is to say, in the power separation circuit area 12 as well as between the pad area 13 and the input-output circuit area 11, the dummy pattern confined sections for forbidding the arrangement of the dummy activation area are set in accordance with the rule similar to that of arranging the dummy wirings on either the conductor-forming layer or on the wiring-forming layer. On the other hand, activation areas are formed in the pad area 13 and in the input-output circuit area 11. Therefore no dummy pattern confined section is set in the pad area 13 and in the input-output circuit area 11 in order to allow the generation of the dummy pattern.

Specifically, according to the rule of setting the dummy pattern confined sections described in Table 2, in the case of the multilayer pad structure circuit, no dummy pattern confined section is set in the pad area 13 and the input-output circuit area 11, and a dummy pattern confined section 41 is set to the power separation circuit area 12. At the same time, if the distance between the pad area 13 and the input-output circuit area 11 is equal to the value Lmax or less, a dummy pattern confined section 42 is set therebetween. The dummy pattern confined sections are illustrated in hatchings in FIG. 6.

In a semiconductor device provided with dummy activation areas that are arranged in accordance with the placement of the above dummy pattern confined sections, dummy activation patterns are not present neither in the area between the pad area 13 and the input-output circuit area 11, nor in the power separation circuit area 12. This prevents the distance between the dummy activation areas and the input-output circuit area 11 to become shorter than necessary, thereby avoiding the creation of an involuntary conductive channel generated due to the deposition of dummy activation areas, the channel including the pad and the dummy activation areas. This avoids the static electricity to be transmitted to the input-output circuit through this involuntary conductive channel.

Figure 7:
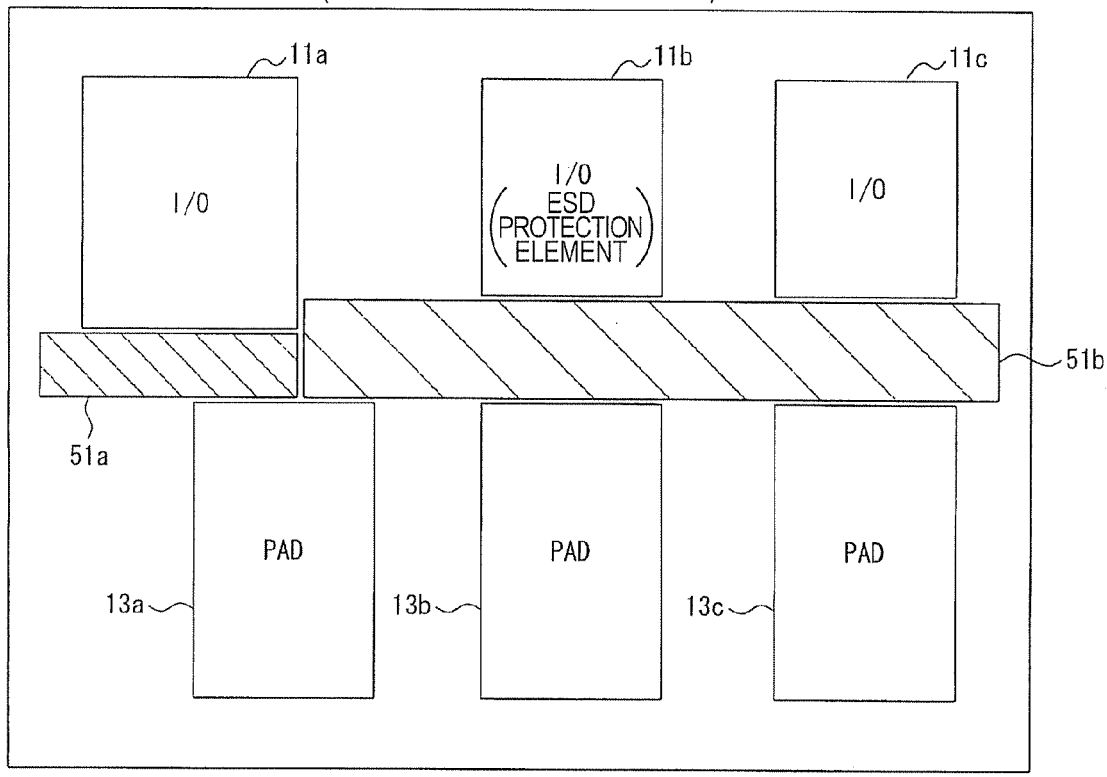
FIG. 7 is an example of a confined section for a dummy activation area, the confined area being set in the multilayer wiring circuit.

In the case of the multilayer wiring circuit, as illustrated with hatchings in FIG. 7, dummy pattern confined sections are neither set to the pad areas 13a to 13c, nor to the input-output circuit area 11a to 11c. If the distance between the pad area 13a and the input-output circuit area 11a is equal to the value Lmax or less, a dummy pattern confined section 51a is set therebetween. Further, if the distances between the pad area 13b and the input-output circuit areas 11b as well as between the pad area 13c and the input-output circuit areas 11c are equal to the value Lmax or less, then a dummy pattern confined section 51b is set in the area therebetween.

In a semiconductor device provided with dummy activation areas that are arranged in accordance with the placement of the above dummy pattern confined sections, dummy activation patterns are not present in the area between the pad area 13 and the input-output circuit area 11. This thereby avoids the creation of an involuntary conductive channel generated due to the deposition of dummy activation areas, the channel including the pad and the dummy activation areas. This avoids the static electricity to be transmitted to the input-output circuit through this involuntary conductive channel.

Figure 8:
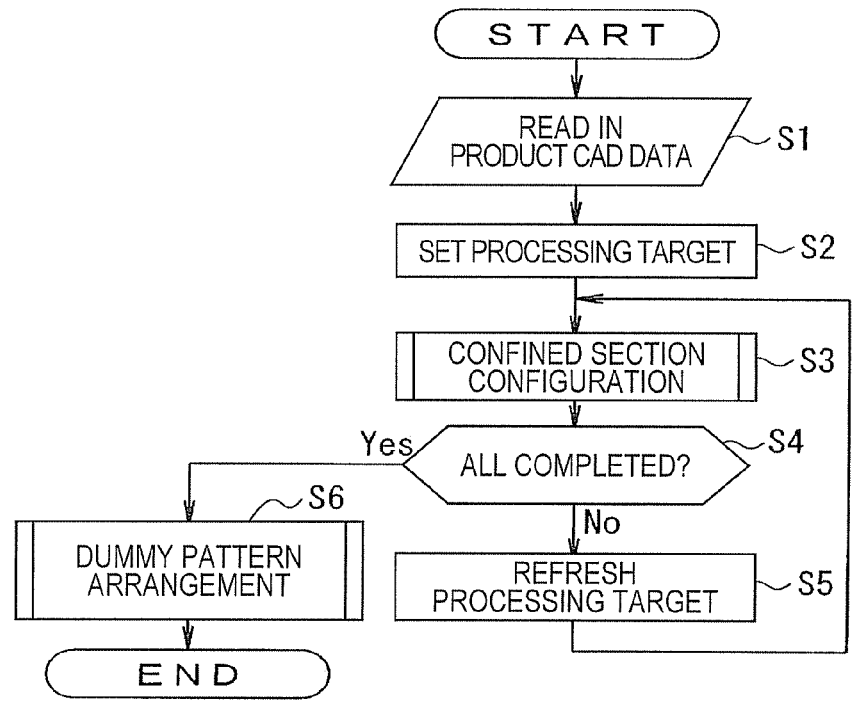
FIG. 8 is a flowchart illustrating an example of processing steps in the layout design device.

The above processing is executed in steps shown in a flowchart referred in FIG. 8.

First, the product CAD data of the semiconductor device that undergoes dummy patterning is loaded in step S1. In other words, sets of loaded information includes: an indication of a circuit block constituting the semiconductor device being either a multilayer pad structure circuit or a multilayer wiring circuit; and placement positions of components of each circuit blocks such as pads, input-output circuits, power separation circuits, and other internal circuits.

Thereafter, the process proceeds to step S2, and sets one of the layers of the multilayer structure semiconductor device as a processing target. In other words, referring back to the case described in FIG. 2, one of the first through fourth layers is set as the processing target. The process then proceeds to step S3, so as to carry out a confined section configuration processing for forbidding the dummy patterning in this processing target.

Figure 9:
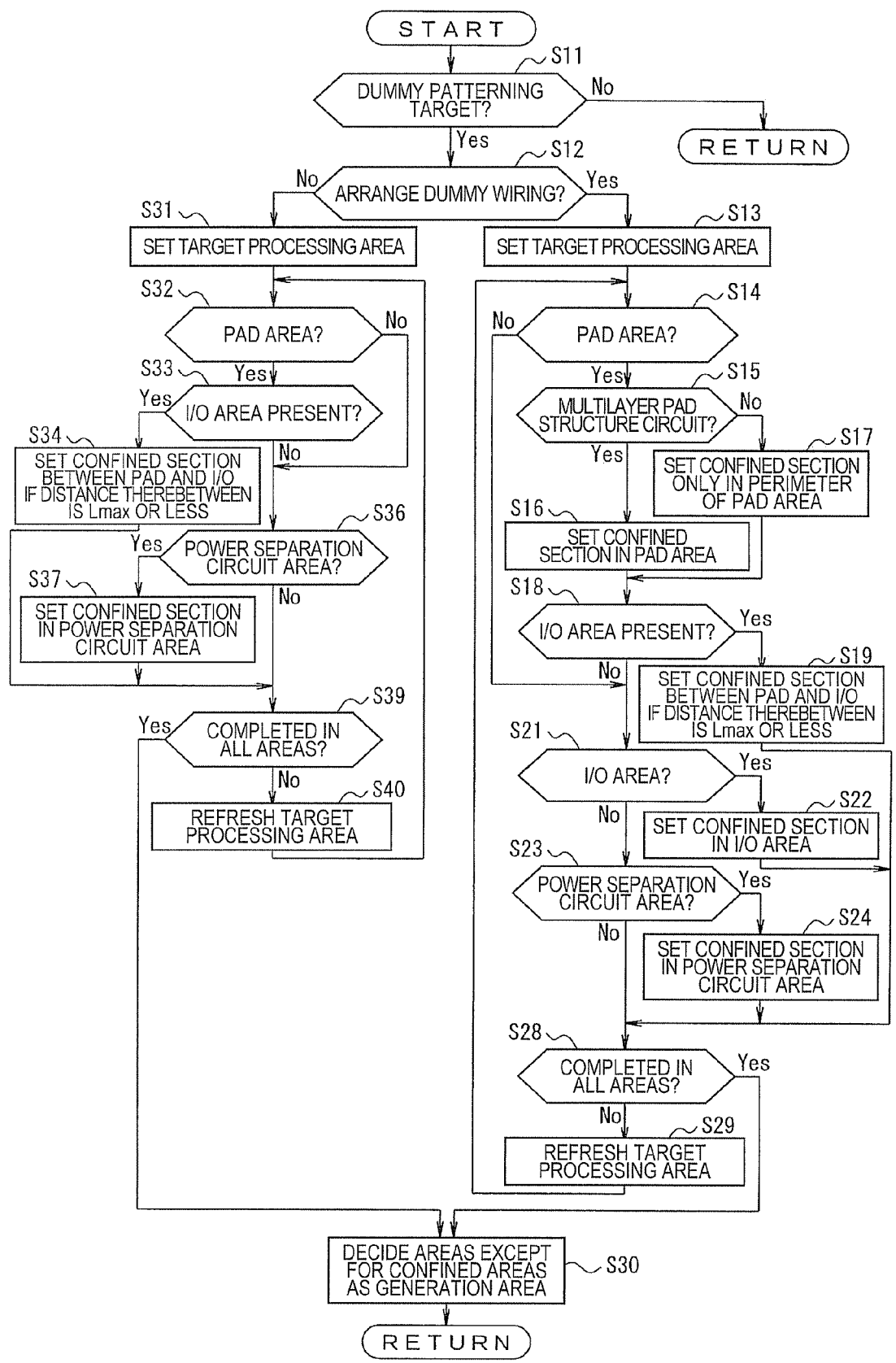
FIG. 9 is a flowchart illustrating an example of processing steps of confined section configuration referred to in FIG. 8.

Specifically, as shown in the flow chart in FIG. 9, it is determined whether or not the layer to be processed is a layer for dummy patterning. In other words, the process determines if the layer is any of the conductor-forming layer, the wiring-forming layer (both of which are for patterning dummy wirings), and a layer for patterning dummy activation areas, the layer including a semiconductor substrate on which element isolation regions are formed.

If the layer to be processed is none of the above, the process determines that there is no need to arrange the dummy patterns and proceeds to step S4 in FIG. 8.

In step S4, the process decides whether or not the configuration of the dummy pattern confined section is carried out to the entire layers. If not, then the process proceeds to step S5 and configure the subsequent layer as the processing target. The process then proceeds back to step S3, and if this processing target is an wiring-forming layer, then the process carries out step S11 and step S12 in FIG. 9. In step S13, based on the placement information of the constituent components of each circuit block, the placement information being specified in the product CAD data, the process sets the first placement area among a plurality of placement areas set for each layer as a processing target area, the placement areas including the constituent components of the circuit blocks arranged therein. In step S14, the process determines whether or not this processing target area is the pad area in which the pad is formed when viewing the semiconductor device from top. If yes, then the process proceeds to step S15, so as to determine if this pad area is a pad area of either the one included in the multilayer pad structure circuit or the one included in the multilayer wiring circuit. If the pad is of the multilayer pad structure circuit, then the process proceeds to step S16, and sets the dummy pattern confined section 21 in the entire pad area as shown in FIG. 3. If the pad is of the multilayer wiring circuit, and not that of the multilayer pad structure circuit, the process proceeds to step S17 so as to set the dummy pattern confined area only in the periphery of the pad area that has the predetermined perimeter width Lw. Consequently, as shown in FIG. 5, the dummy pattern confined sections 31a to 31c are set only in the periphery of the pad areas, but not in the pad areas themselves.

The process then proceeds to step S18, and determines if the input-output circuit area that includes an input-output circuit formed therein exists adjacently to the pad area in plan view. If an input-output circuit area is present in a location adjacent to any of the four sides of the pad area, then the process proceeds to step S19, and detects the distance between the pad area and the input-output circuit area that are adjacent to each other, so as to set the dummy pattern confined section therebetween, if the distance is equal to the maximum value Lmax or less. Consequently, the multilayer pad structure circuit includes the dummy pattern confined section 24 set therein as shown in FIG. 3, and the multilayer wiring circuit includes the dummy pattern confined sections 33a and 33b set therein as shown in FIG. 5.

Thereafter, the process proceeds to step S28, and if the processing is not carried out to all the areas set within the processing target layer, then the process proceeds to step S29, so as to refresh the processing target area, and thereafter returns to step S14.

If the processing target area is the pad area, then the dummy pattern is set in a manner which depends on whether this area is the multilayer pad structure circuit or the multilayer wiring circuit (steps S15 to S17). If the input-output circuit area is present adjacently to the pad area and the distance therebetween is equal to the maximum value Lmax or less, then the dummy pattern confined section is set in the area therebetween. If this distance is larger than the maximum value Lmax, then the process proceeds to step S28, so as to refresh the processing target area if the processing is not carried out to all the areas, thereafter returning to step S14.

Referring back to step 14, if the processing target area is not a pad area, then the process proceeds to step S21, so as to determine whether or not this processing target area is an input-output circuit area. If yes, then the process proceeds to step S22 and sets the dummy pattern confined section in this input-output circuit area. In other words, the dummy pattern confined section 22 is set in the configuration described in FIG. 3, and the dummy pattern confined sections 32a to 32c are set in the configuration described in FIG. 5. Thereafter, the process proceeds to step S28, and carries out the processing of the subsequent processing target area.

Referring back to step 21, if the processing target area is neither a pad area nor an input-output circuit area, then the process proceeds to step S23, so as to determine whether or not this processing target area is a power separation circuit area. If yes, then the process proceeds to step S24 and sets the dummy pattern confined section in this power separation circuit area. In other words, the dummy pattern confined section 23 is set in the configuration described in FIG. 3, while a dummy pattern confined section corresponding to a power separation circuit area is not set, since a power separation circuit area is not present in the case described in FIG. 5.

After setting the dummy pattern confined sections as described above, the process then proceeds to step S28, and carries out processing of the subsequent processing target area. Once processing for all the areas is completed, the process proceeds from step S28 to step S30, so as to set the areas, excluding the ones that have the dummy pattern confined sections set thereon (in other words, the areas including the constituent areas and areas therebetween), as areas for creating the dummy patterns, thereafter ending the processing.

Consequently, as shown in FIGS. 3 and 5, the dummy pattern confined sections are set in accordance with the rule indicated in Table 1.

Referring back to FIG. 8, the process proceeds from step S3 to step S4, and determines if the processing is carried out to all the layers of the multilayer semiconductor device. If not, then the process proceeds to step S5 and sets the subsequent layer as the processing target, thereafter returning to step S3, so as to extract the placement information of this processing target.

If this processing target is not a layer for patterning dummy wirings, but is a layer for arranging dummy activation areas, the layer including a semiconductor substrate on which the element isolation regions are formed, then the process carries out step S11 and step S12 in FIG. 9, thereafter proceeding to step S31. In step S31, based on the placement information of the constituent components of each circuit block, the process sets the first placement area, specified out of a plurality of placement areas set for each layer, to be a processing target area, the placement areas including the constituent components of the circuit blocks arranged therein. In step S32, the process determines whether or not this processing target area is the pad area in which the pad is formed when viewing the semiconductor device from top. If the processing target area is the pad area, then the process proceeds to step S33, so as to determine whether or not an input-output circuit area is present adjacently to this pad area, and if yes, then proceeding to step S34. Here, if the distance between the pad area and the input-output circuit area is equal to the maximum value Lmax or less, then the process sets, in the area therebetween, either the dummy pattern confined section 42 or the dummy pattern confined sections 51a and 51b. If this distance is larger than the maximum value Lmax, then the process proceeds to step S39, so as to refresh the processing target area if the processing is not carried out to all the areas, thereafter returning to step S32.

Figure 6:
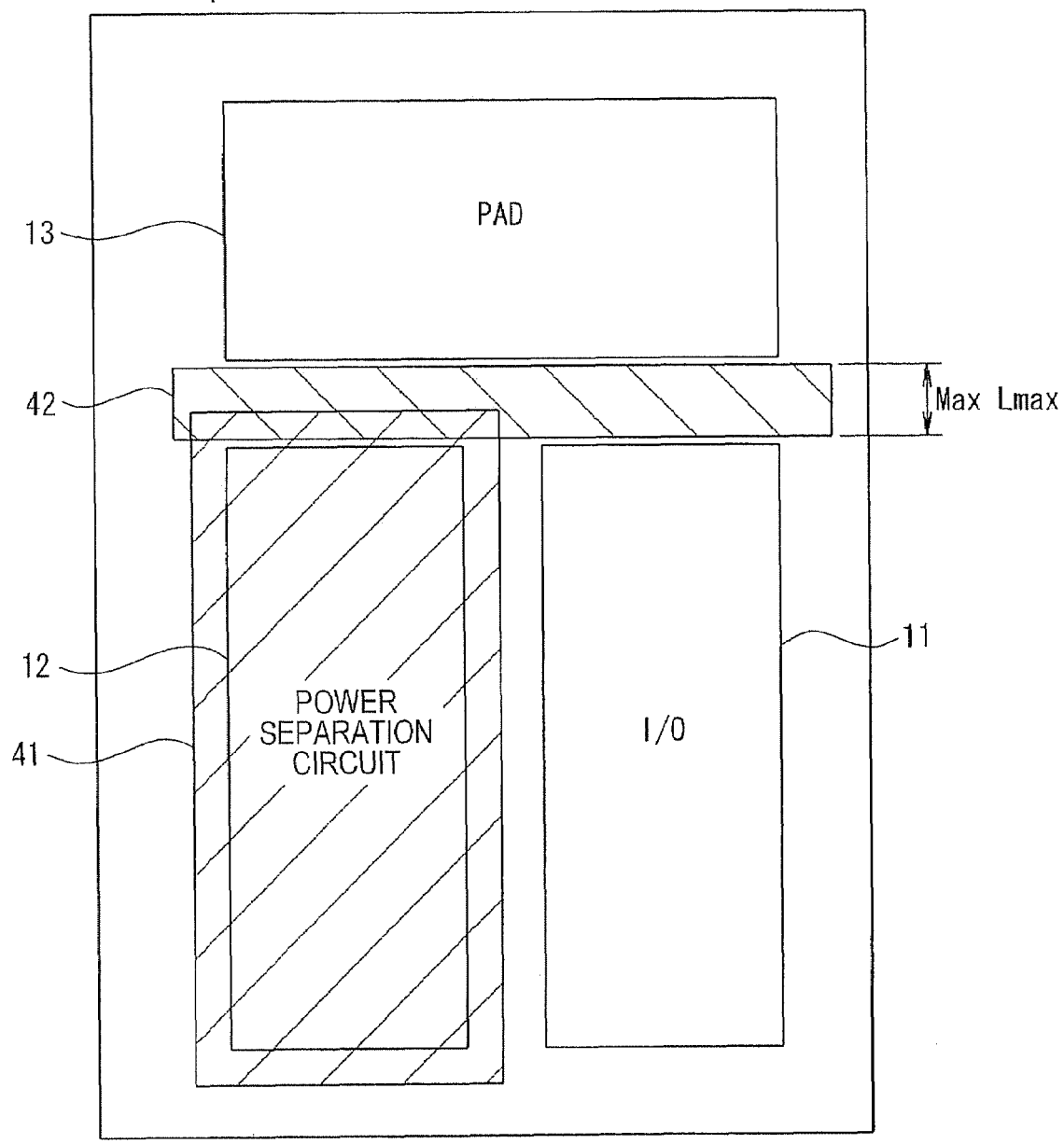
FIG. 6 is an example of a confined section for a dummy activation area, the confined section being set in the multilayer pad structure circuit.

On the other hand, even though a pad area is present, if an input-output circuit area is not present adjacently to the pad area, the process proceeds from step S33 to step S36, while if the target processing area is not a pad area, the process proceeds from step S32 to step S36. In step S36, if the target processing area is a power separation circuit, the process proceeds to step S37, and sets, in this area, the dummy pattern confined section 41 as shown in FIG. 6, thereafter proceeding to step S39. If the target processing area is not a power separation circuit, the process directly proceeds to step S39. Once processing for all the areas is completed, the process proceeds from step S39 to step S30, so as to set the areas excluding the areas of dummy pattern confined sections to areas where the formation of the dummy patterns is allowed. In this case, since the layer includes the semiconductor substrate, these areas are set to allow the arrangement of the dummy activation areas in the STI structure.

Subsequently to the completion of setting the dummy pattern confined sections in the processing target, and referring back again to FIG. 8, the process proceeds from step S3 to step S4, so as to decide whether or not the processing is completed in all the layers constituting the semiconductor device. If the processing is not completed for all the layers, then the process returns to step S5 to refresh the processing target, and thereafter sets the dummy pattern confined sections in the similar steps described above. Upon completion of the processing of all the layers, it is determined that configuration of the dummy pattern confined areas is completed for the subsequent arrangement of the dummy wirings on the conductor-forming layers or on wiring-forming layers, as well as for the subsequent arrangement of the dummy activation areas in the element isolation areas. The process then proceeds to step S6, and carries out the arrangement of the dummy patterns.

The patterning may be carried out in known steps. At this time, the dummy patterns are arranged only in the areas except for the areas specified by the dummy pattern confined sections. In other words, if the layer includes the semiconductor substrate, then the dummy activation areas are arranged in the element isolation areas of the substrate, and if the layer is the wiring-forming layer or the conductor-forming layer, then the dummy wirings are patterned. The processing ends after arranging the dummy patterns in the areas except for the ones specified by the dummy pattern confined section.

Consequently, all the layers constituting the semiconductor device includes the confined sections configured therein, forbidding the patterning of the dummy wirings or the dummy activation areas. In the process of dummy patterning, the dummy patterns are arranged in the areas except for the dummy pattern confined sections.

As described, the dummy pattern confined sections are formed in the areas that are predicted to form a conductive channel of static electricity, and these areas do not have dummy patterns which causes the occurrence of involuntary conductive channel, the dummy patterns including dummy wirings or dummy activation areas. This allows avoiding the formation of involuntary conductive channels, thereby avoiding the placement of the dummy patterns to produce the involuntarily formed conductive channels.

At the same time, the flatness can also be ensured even when there is a prediction that the flatness cannot be ensured during the subsequent processes such as CMP without arranging the dummy patterns, since the dummy pattern confined sections set between the pad areas and the input-output areas are present only when the distance therebetween is equal to or less than the maximum value Lmax. In other words, when this distance is larger than the maximum value Lmax, the dummy pattern confined sections are not set therebetween.

Further, the occurrence of an involuntarily formed conductive channel is avoided while ensuring the flatness of the pad areas, since the dummy pattern confined section is set only in the periphery of the pad area, and not in the pad area itself, so that the dummy patterns can be arranged on the pad areas that do not include the wirings arranged therein.

This embodiment is applied to a layout design device that receives the product CAD data and thereafter configures and places the dummy pattern confined sections based on that product CAD data. The embodiment is not limited thereto, and may also be applied to a layout design device that generates product CAD data and thereafter configures and places the dummy pattern confined sections.

What is claimed is:

1. A semiconductor device having a multilayer structure, each layer comprising:
    a dummy pattern for ensuring a flatness thereof;
    a pad area in which a bonding pad is formed;
    an input-output circuit area in which an input-output circuit is formed, the input-output circuit area being adjacent to the pad area in plan view; and
    a dummy pattern confined area for forbidding an arrangement of the dummy pattern in every layer included in the semiconductor device, the dummy pattern confined area being provided between the pad area and the input-output circuit area in plan view.

2. The semiconductor device according to claim 1, wherein:
    the dummy pattern confined area is provided between the pad area and the input-output circuit area adjacent thereto, only if a distance therebetween is equal to or less than a defined value set in advance; and
    the defined value is set to produce a distance which allows ensuring the flatness.

3. The semiconductor device according to claim 1, wherein:
    the dummy pattern serves as a dummy wiring;

the bonding pad and the input-output circuit constitute a circuit having a multilayer pad structure, every layer thereof, being lower than the bonding pad, including a conductor arranged on the entire surface of the pad area in plan view; and the dummy pattern confined area is provided, in plan view, to the pad area, to the input-output circuit area, and to a power separation circuit area in which a power separation circuit for separating a power system is formed.

4. The semiconductor device according to claim 1, wherein:

the dummy pattern serves as a dummy wiring;

the bonding pad and the input-output circuit constitute a circuit having a structure in which the bonding pad is formed only on the top layer of a multilayer wiring, a wiring formed in the pad area in plan view, the wiring being included in each lower layer under the bonding pad; and the dummy pattern confined area is provided, in plan view, to the input-output circuit area, to a power separation circuit area in which a power separation circuit for separating a power system is formed, and to an area having a predetermined width set in advance, the area being peripheral to the pad area.

5. The semiconductor device according to claim 1, wherein:

the dummy pattern serves as a dummy activation area formed in a moiety of shallow trench isolation structure; and the dummy pattern confined area is provided, in plan view, also to the power separation circuit area in which the power separation circuit for separating the power system is formed.

6. A method for designing a layout of a semiconductor device having a multilayer structure provided with a dummy pattern for ensuring a flatness, the method comprising:

providing a dummy pattern confined area for forbidding an arrangement of the dummy pattern to every layer in the semiconductor device, the dummy pattern confined area being provided to at least, in plan view, between a pad area and an input-output circuit area, the pad area including a bonding pad formed therein, and the input-output circuit area being adjacent to the pad area and including an input-output circuit formed therein.

7. A layout design device for designing a layout of a semiconductor device, comprising:

input means for inputting device information including placement position information of each unit constituting a semiconductor device which has a multilayer structure provided with a dummy pattern for ensuring flatness, a layout design being carried out separately for each layer constituting the semiconductor device;

search means for searching, in each layer, a presence of an area which fulfills a configuration condition of a dummy pattern confined area, the configuration condition set in advance, and the searching being based on the device information input by the input means;

confined area configuration means for setting, in each layer, the dummy pattern confined area, if an area which fulfills the configuration condition is found by the search means, the dummy pattern confined area being set in an area which corresponds to the area found; and dummy pattern arranging means for arranging a dummy pattern in an area excluding an area in which the dummy pattern confined area is set by the confined area configuration means;

the configuration condition of the dummy pattern confined area being a condition to include, in top view, at least an area between a pad area and an input-output circuit area, the pad area including a bonding pad formed therein, and the input-output circuit area being adjacent to the pad area and including an input-output circuit formed therein.

* * * * *